(12) United States Patent
Yajima et al.

(10) Patent No.: US 7,483,506 B2
(45) Date of Patent: Jan. 27, 2009

(54) BIT SYNCHRONIZATION CIRCUIT WITH PHASE TRACKING FUNCTION

(75) Inventors: Yusuke Yajima, Fujisawa (JP); Tohru Kazawa, Kokubunji (JP); Yoshihiro Ashi, Yokohama (JP)

(73) Assignee: Hitachi Communication Technologies, Ltd., Tokyo (JP)

( * ) Notice: Subject to any disclaimer, the term of this patent is extended or adjusted under 35 U.S.C. 154(b) by 603 days.

(21) Appl. No.: 11/299,819

(22) Filed: Dec. 13, 2005

(65) Prior Publication Data

US 2007/0030937 A1    Feb. 8, 2007

(30) Foreign Application Priority Data

Aug. 3, 2005    (JP)    ............................. 2005-225053

(51) Int. Cl.
*H04L 7/00*    (2006.01)
*H04J 3/06*    (2006.01)

(52) U.S. Cl. ...................... 375/365; 370/509
(58) Field of Classification Search ................. 375/355, 375/356, 362–365, 371, 373, 376; 370/509–514; 327/141, 162, 155, 156

See application file for complete search history.

(56) References Cited

U.S. PATENT DOCUMENTS 6,711,220 B1 *   3/2004   Yoshida et al. ............... 375/354
7,239,813 B2 *   7/2007   Yajima et al. ................ 398/154

FOREIGN PATENT DOCUMENTS

JP          9-36849 A        2/1997
JP          2005-12305 A     1/2005

* cited by examiner

*Primary Examiner*—Tesfaldet Bocure
(74) *Attorney, Agent, or Firm*—McDermott Will & Emery LLP

(57) ABSTRACT

A bit synchronization circuit comprising an initial phase determining unit for rapidly determining, during a period of receiving a preamble of burst data, a clock with a phase synchronized with received burst data from among multi-phase clocks having the same frequency as an internal reference clock and a phase tracking unit for modifying the synchronized phase clock responsive to phase variation of received data during a period of receiving a payload of burst data by taking the synchronized phase clock determined by the initial phase determining unit as an initial phase. The bit synchronization circuit retimes burst data with a data retiming clock having a predetermined phase relation with the synchronized phase clock and outputs the burst data in synchronization with the internal reference clock.

13 Claims, 11 Drawing Sheets

BURST DATA 200

BIT SYNCHRONIZATION CIRCUIT

FIG. 8
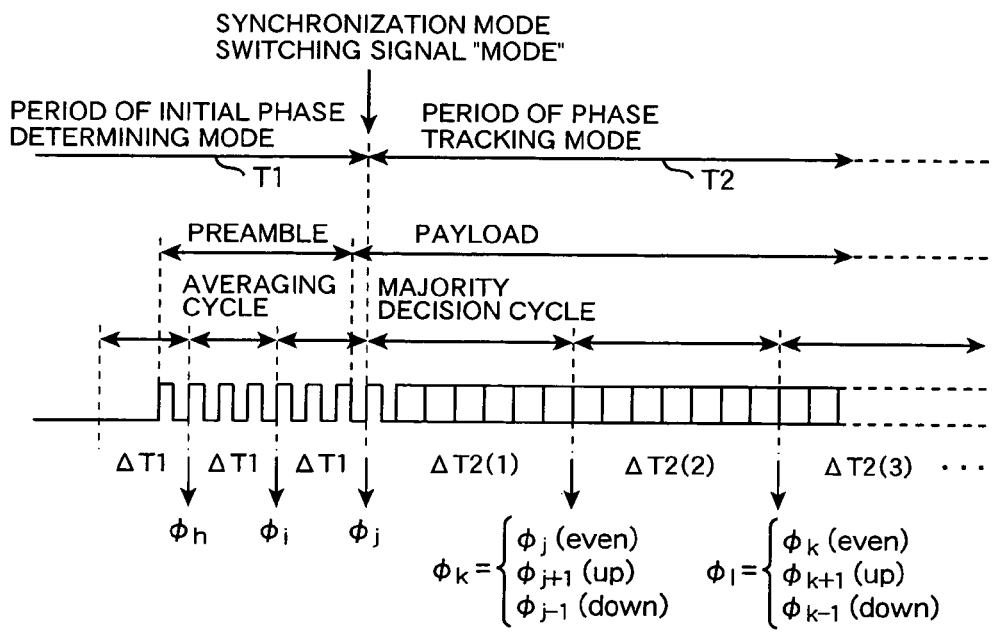
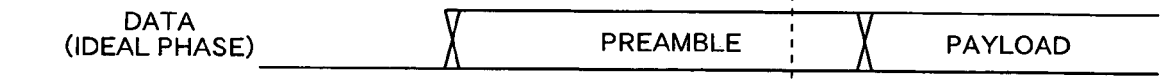
FIG. 9A
DATA (IDEAL PHASE)
FIG. 9B
DATA (MOST ADVANCED PHASE)
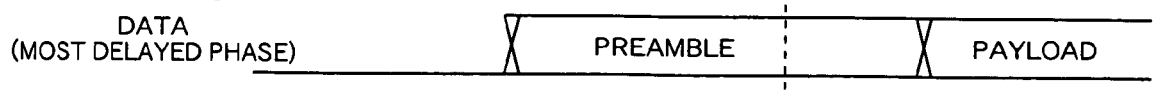
FIG. 9C
DATA (MOST DELAYED PHASE)

FIG. 12A INPUT DATA

FIG. 12B PHASE DETECTION CLOCK

FIG. 12C IDEAL DATA PHASE

| No. | (1) | (2) | (3) | (4) | RESULT OF PHASE DETERMINATION |
|---|---|---|---|---|---|
| 1 | — | — | — | — | — |
| 2 | EDGE | — | — | — | up |
| 3 | — | EDGE | — | — | down |
| 4 | EDGE | EDGE | — | — | up |
| 5 | — | — | EDGE | — | up |
| 6 | EDGE | — | EDGE | — | up |
| 7 | — | EDGE | EDGE | — | down |
| 8 | EDGE | EDGE | EDGE | — | — |
| 9 | — | — | — | EDGE | down |
| 10 | EDGE | — | — | EDGE | down |
| 11 | — | EDGE | — | EDGE | down |
| 12 | EDGE | EDGE | — | EDGE | — |
| 13 | — | — | EDGE | EDGE | up |
| 14 | EDGE | — | EDGE | EDGE | — |
| 15 | — | EDGE | EDGE | EDGE | — |
| 16 | EDGE | EDGE | EDGE | EDGE | — |

…

BIT SYNCHRONIZATION CIRCUIT WITH PHASE TRACKING FUNCTION

CLAIM OF PRIORITY

The present application claims priority from Japanese application serial No. 2005-225053, filed on Aug. 3, 2005, the content of which is hereby incorporated by reference into this application.

BACKGROUND OF THE INVENTION (1) Field of the Invention

The present invention relates to a bit synchronization circuit and, more particularly, to a bit synchronization circuit suitable for converting high-speed burst data signals received from a transmission line into data signals synchronized with an internal reference clock.

(2) Description of Related Art

As a transmission system that relays burst signals transmitted from multiple terminals, a Passive Optical Network (PON) system is known. The PON system is an optical transmission system having a topology, as shown in FIG. 2, wherein each of optical fibers 11 (11-1 to 11-m) connected to a central office side apparatus (Optical Line Terminal: OLT) 1A diverges, with an optical splitter (star coupler) 12 located on each optical fiber, into branch optical fibers 13 (13-1 to 13-n) for connecting with subscriber connection apparatuses (Optical Network Units: ONUs) 10 (10-1 to 10-n).

To each subscriber connection apparatus 10, at least one subscriber terminal (not shown) is connected and data transmitted from each subscriber terminal is forwarded via the central office side apparatus 1A to a core network 14. The core network 14 may be either the Internet to which various servers to be accessed by subscriber terminals are connected or a transit network for connecting a plurality of central office side apparatuses (1A, 1B, . . . ). The PON can provide an economical Fiber to the Home (FTTH) access network, because it enables multiple subscribers to share an optical fiber transmission line 11 and a low cost star coupler 12 which is easy to maintain can be used as a device to diverge the optical fiber transmission line 11 into a plurality of branch optical fibers 13.

The PON is classified, for example, into a Broadband PON (B-PON) that transmits data in the form of ATM cells, a Gigabit PON (G-PON) that enables high-speed data transfer in the order of gigabits per second, and a Giga-Ethernet PON (GE-PON) suitable for Ethernet services.

In the PON system, upstream data frames transmitted from the subscriber connection apparatus 10 to branch optical fibers 13 are time division multiplexed on the optical fiber 11. Each upstream data frame 200 is comprised of a preamble 210 and payload 220, as shown in FIG. 3, and the payload 220 includes data packets transmitted from each subscriber terminal.

To avoid collision of data transmitted from a plurality of subscriber connection apparatuses on the optical fiber 11, each subscriber connection apparatus 10 transmits its upstream data frame 200 within a time zone specified from the central office side apparatus 1A. In consequence, a plurality of upstream data frames are time division multiplexed on the optical fiber 11, locating no-signal intervals (guard time) between frames, and are input as burst data to the central office side apparatus 1A.

On the other hand, downstream data transmission from the central office side apparatus 1A to the subscriber connection apparatuses 10-1 to 10-n is performed in a broadcast communication manner. In a downstream data frame transmitted from the central office side apparatus 1A to an optical fiber 11-1, a plurality of data packets with different destination addresses are arranged continuously without locating no-signal intervals between them. Each of the downstream data frames is multicasted to the branch optical fibers 13-1 to 13-n by the optical coupler. Each subscriber connection apparatus 10 selectively takes in only a packet addressed thereto, by determining the destination address of each packet included in a received frame, and forwards the packet to the destination subscriber terminal.

Each downstream data frame is transmitted at a frequency f0 synchronized with an internal reference clock of the central office side apparatus 1A or at a multiplier frequency of f0. Each subscriber connection apparatus 10 extracts the basic clock from the downstream frame and transmits respective upstream data frames at the frequency f0 synchronized with the internal reference clock. That is, the frequency of upstream burst data received by the central office side apparatus 1A is synchronous with the internal reference clock.

In the PON system, however, when each upstream data frame (burst data) arrives at the central office side apparatus 1A, a phase difference relative to the above internal reference clock varies depending on the subscriber connection apparatus, because the branch fibers 13-1 to 13-n diverging from the optical splitter 12 have different lengths. Therefore, the central office side apparatus 1A has to perform bit synchronization for each burst data after performing optical-to-electrical conversion on burst data received from the optical fiber 11.

FIG. 4 shows a model of burst data which is input to a bit synchronization circuit (timing extraction circuit) in the central office side apparatus 1A. Each burst data includes a preamble 210 comprising of, for example, a sequence of alternating "1" and "0" bits preceding a payload 220, as described for FIG. 3. The central office side apparatus 1A has to establish bit synchronization for each burst data during a period of receiving the preamble 210. On the other hand, data effective for a subscriber connection apparatus is carried with payload 220 and it is desired to make the preamble 210 as short as possible in order to improve transmission efficiency in a PON section.

The central office side apparatus 1A also needs an Automatic Threshold Control (ATC) function to detect an input signal level for each burst data and to automatically change a threshold Th for discriminating high and low levels of the input signal at a stage previous to the bit synchronization circuit. This is because the amount of attenuation of the burst data signal during transmission on an optical fiber varies depending on the length of the optical fiber through which the burst data passes. Since the ATC generally determines the threshold Th by detecting the peak level of the input signal, it is known that, when a noise component such as spike noise is superimposed on burst data, the threshold Th is set at a higher level than an ideal level and a pulse width distortion occurs, as denoted by W (L) and W (H), in the input signal of the bit synchronization circuit.

In the G-PON having a transmission capacity in the order of gigabits per second, there is a possibility that long burst data, for example, with a duration of 125 µs, is input to the bit synchronization circuit of the central office side apparatus 1A, because each subscriber connection apparatus 10 is allowed to transmit variable length burst data. For long burst data, it is necessary to take into consideration that phase variation will occur due to jitter/wander during burst data reception or due to out of frequency synchronization between the internal reference clock and received burst data. Therefore, a PON system which allows variable length burst data transmission requires a bit synchronization circuit that has a function of tracking a phase variation during a payload receiving period in addition to a function of determining an initial phase during a preamble receiving period.

To solve the above-described problem, for example, Japanese Unexamined Patent Publication No. 2005-012305 (patent document 1) proposes a bit synchronization circuit of an optimum phase data selection type, which is comprised of, as shown in FIG. 5, a multi-phase data sampling unit 50 for converting received burst data into N-phase data streams, a phase determining unit 51 for generating a control signal indicating an optimum phase data stream, an output data selector 55 for selecting an optimum phase data stream indicated by the control signal from among the N-phase data streams, a missing data supplying unit 56 for supplying data that is missed when the optimum phase data is switched from one to another, and an output data synchronizing unit 60 for converting the optimum phase data stream supplied from the output data selector 55 into a data stream synchronized with the reference clock. The phase determining unit 51 repeatedly performs an operation of detecting an optimum phase data stream during a period of receiving the same burst data. When the optimum phase changes, the output data selector 55 dynamically switches to the optimum phase data stream to be supplied to the output data synchronizing unit 60.

Here, the multi-phase data sampling unit 50 generates N-phase data streams by latching received data with N-phase clocks generated by delaying the reference clock CL and reading out the latched N-phase data in synchronization with the reference clock CL. The phase determining unit 51 generates a switching control signal SC and a data stream correction signal SP, based on an optimum phase determined from signal change points of received data and a mask signal M generated by a mask signal generator 54. The switching control signal SC is supplied to the output data selector 55 and the data stream correction signal SP is supplied to a data transfer control unit in the output data synchronizing unit 60. The output data selector 55 selects an optimum phase data stream D1 from among N-phase data streams output from the multi-phase data sampling unit 50 in accordance with the switching control signal SC and supplies the data stream to data storage 57.

As described, for example, in Japanese Unexamined Patent Publication No. H9(1997)-36849 (patent document 2), the phase determining unit 51 can select, by performing dual edge detection for detecting rising and falling pulse edges, a data stream having the greatest phase margins at both rising and falling edges of a pulse in comparison to the internal reference clock from among N-phase data, even if a pulse width distortion occurs. In the above patent document 1, detection of signal change points and determination of the optimum phase are performed for the entire length of received burst data and data missing or duplication, which may occur when the optimum data stream is switched to another data stream beyond the boundary of a clock cycle, is compensated by the missing data supplying unit 56 and the data transfer control unit 58.

However, the bit synchronization circuit described in the above patent document 1 intends to realize, with a single circuit, both the function of pulling into synchronization at the initial stage of burst data reception which starts in a state where a signal phase is unpredictable at all and the function of tracking a relatively moderate phase variation occurring after the initial phase is established, so that this circuit involves following problems.

Specifically, in order to rapidly pull the received burst data whose phase is unknown into synchronization, the phase determining unit 51 determines an optimum phase data stream by dual edge detection and supplies the result to the output data selector 55, thereby to dynamically or discretely switch over among multi-phase data. However, dynamic switching of output data to another phase data stream in accordance with the result of optimum phase data determination is a deviation from the intended purpose of the operation for the phase tracking operation performed after the initial phase is established. That is, in the above prior art, even if an error occurs in determining optimum phase data stream by the phase determining unit 51 due to, for example, noise or the like, the output data selector 55 instantaneously switches the optimum data stream from the current phase to another phase, jumping over multiple phases. As a result, continuity of output data is lost and contrivance is needed for compensating data missing or duplication.

In the above prior art, because a dual edge detection circuit and an operation circuit for optimum phase determination in the phase determining unit 51 are driven during the entire length of each burst data input, these circuits continue to consume power as long as burst data is received. Since the operation for optimum phase determination adaptive to a pulse width distortion has been completed within the preamble receiving period, it is meaningless to perform the operation for optimum phase determination based on the dual edge detection even for a period of receiving a payload in which a sequence of alternating "0" and "1" bits is not ensured. As a result, power is consumed uselessly in the phase determining unit 51.

SUMMARY OF THE INVENTION

An object of the present invention is to provide a bit synchronization circuit suitable for receiving, with reduced power consumption, variable length burst data.

Another object of the present invention is to provide a bit synchronization circuit capable of phase tracking within the payload receiving period without losing continuity of output data.

To achieve the foregoing objects, a bit synchronization circuit of the present invention is provided with an initial phase determining unit for rapidly determining a clock with a phase synchronized with received burst data from among multi-phase clocks having the same frequency as an internal reference clock during a period of receiving a preamble of the burst data and a phase tracking unit for modifying the synchronized phase clock responsive to phase variation of received data during a period of receiving a payload of the burst data by applying the synchronized phase clock determined by the initial phase determining unit as an initial phase. The payload of the burst data is retimed with a data retiming clock having a predetermined phase relation with the synchronized phase clock and the retimed burst data is output in synchronization with the internal reference clock.

More specifically, the bit synchronization circuit of the present invention comprises a multi-phase clock generator for generating multi-phase clocks with different phases and having the same frequency as the internal reference clock, an initial phase determining unit for detecting change points of received signal using the multi-phase clocks and outputting initial phase information including a phase number of a clock synchronized with the change points, during a period of receiving the preamble of the burst data, a clock switching unit for switching a data retiming clock and a phase detection clock to an optimum phase clocks, respectively, a phase tracking unit for converting the received data into data retimed according to the data retiming clock, determining whether the phase of the signal change points of the received signal is advanced or delayed relative to the phase detection clock, and outputting a phase correction signal corresponding to a result of the determination, during a period of receiving the payload of the burst data, and a data storage unit for temporarily storing the retimed data output from the phase tracking unit and outputting the data in synchronization with the internal reference clock.

The clock switching unit selects a first data retiming clock and a first phase detection clock to be supplied to the phase tracking unit from among the multi-phase clocks, based on the initial phase information output from the initial phase determining unit, and subsequently, switches the data retiming clock and the phase detection clock to be supplied to the phase tracking unit to optimum phase clocks according to the phase correction signal output from the phase tracking unit.

According to an embodiment of the present invention, the clock switching unit comprises a pointer unit for generating a clock selection control signal in accordance with the initial phase information output from the initial phase determining unit and the phase correction signal output from the phase tracking unit, and a clock selector for selecting an optimum data retiming clock and an optimum phase detection clock to be supplied to the phase tracking unit from among the multi-phase clocks generated by the multi-phase clock generator, according to the clock selection control signal.

According to an embodiment of the present invention, the phase tracking unit comprises a received data retiming unit for converting received data into retimed data in synchronization with the data retiming clock and outputting the retimed data, a phase comparator for determining whether the phase of the signal change points of the received signal is advanced or delayed relative to the phase detection clock, and outputting a result of the determination, and a majority decision unit for making a majority decision on results of the determination output from the phase comparator for every predetermined period and generating a phase correction signal to optimize the phase detection clock.

According to an embodiment of the present invention, the initial phase determining unit comprises a data sampling unit for sampling received signals with the multi-phase clocks generated by the multi-phase clock generator and outputting phase aligned multi-phase data as a result of the sampling, an edge detector for detecting change points of the received signal based on the multi-phase data output from the data sampling unit, and outputting a phase number of a clock synchronized with the signal change points, an optimum phase determining unit for determining periodically a phase number of a synchronized phase clock synchronized with the change points of received signal and a phase number of an optimum data retiming clock for every unit period based on the phase numbers output from the edge detection unit, and an optimum phase averaging unit for averaging the phase numbers of the synchronized phase clocks and the phase numbers of optimum data retiming clocks output from the optimum phase determining unit, respectively, for every averaging period longer than the unit period and outputting the averaged phase numbers as the initial phase information.

In the bit synchronization circuit of the present invention, power consumption can be reduced by switching between the operation period of initial phase determining unit and the operation period of phase tracking unit with a synchronization mode switching signal. In an instance where the bit synchronization circuit of the present invention is applied to each line interface of a central office side apparatus in a PON system, the synchronization mode switching signal can be supplied from a controller of each line interface. In this case, by using the synchronization mode switching signal, the controller can activate the initial phase determining unit before receiving burst data from a subscriber connection apparatus, deactivate the initial phase determining unit and activate the phase tracking unit at timing when the preamble terminates in a case of receiving burst data with the most advanced phase as predicted.

The bit synchronization circuit of the present invention is equipped with the initial phase determining unit for rapidly determining a synchronized phase clock during the period of receiving the preamble of burst data and the phase tracking unit for modifying the synchronized phase clock responsive to phase variation of received data during the period of receiving the payload of burst data and performs retiming of received burst data according to a multi-phase clock selection method. Therefore, it is possible to realize bit synchronization not subject to burst length, ensuring output data continuity, and with reduced power consumption.

BRIEF DESCRIPTION OF THE DRAWINGS

FIG. 8 is a timing chart for outlining the operation of the bit synchronization circuit of the present invention.

FIGS. 9A, 9B, and 9C are charts showing timing of synchronization mode switch over in the bit synchronization circuit using the synchronization mode switching signal "MODE."

FIGS. 12A, 12B, and 12C show relationships between waveforms of input burst data and results of phase determination output from a phase comparator 121 shown in FIG. 1.

DETAILED DESCRIPTION OF THE PREFERRED EMBODIMENTS

Figure 6:
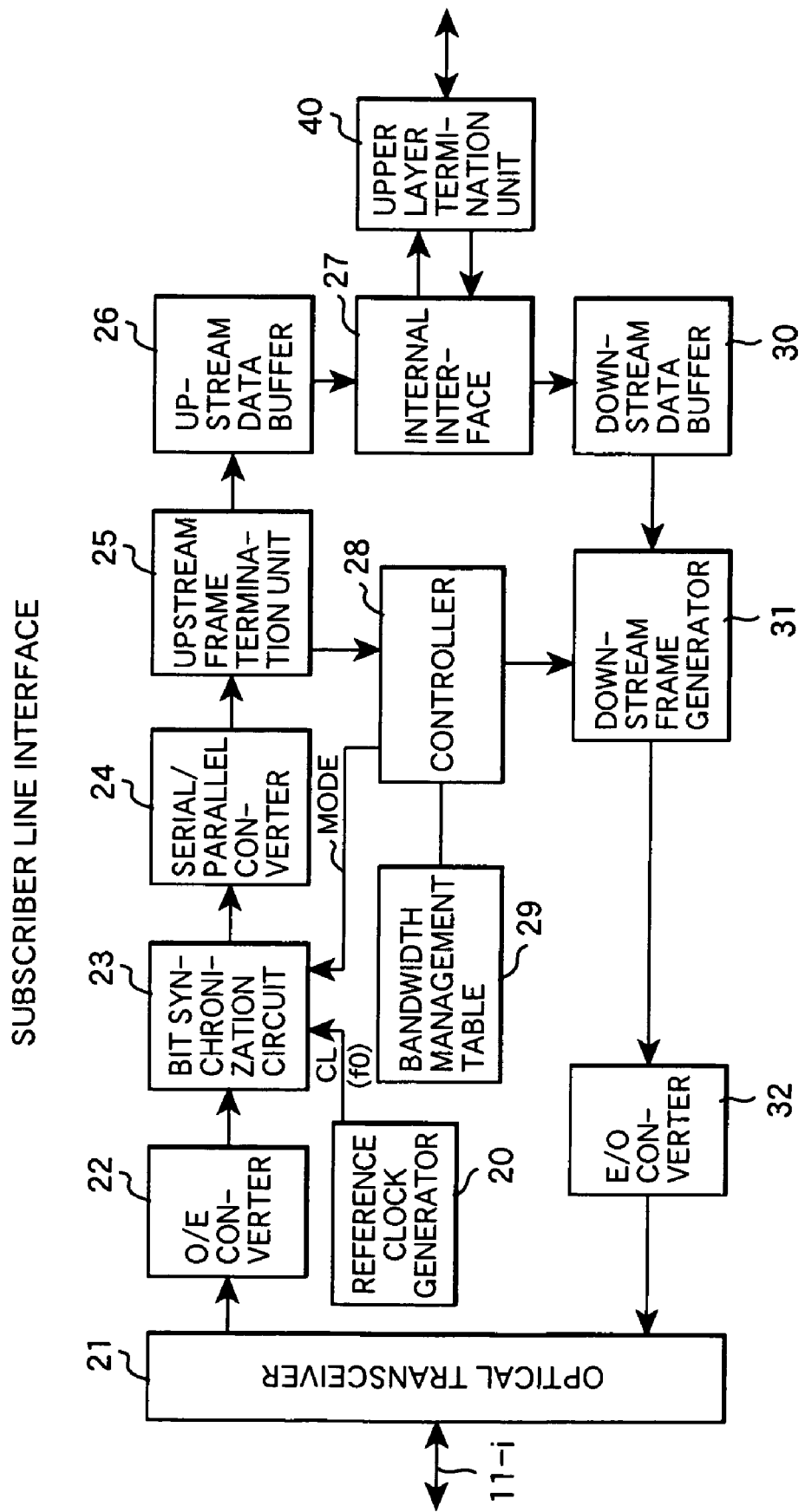
FIG. 6 is a block diagram showing an embodiment of a subscriber line interface provided in a PON central office side apparatus to which a bit synchronization circuit 23 of the present invention is applied.

FIG. 6 shows an embodiment of a subscriber line interface provided in a central office side apparatus 1A.

The subscriber line interface includes an optical transceiver 21 connected to an optical fiber 11-i, an O/E converter 22 for converting upstream optical signals received by the optical transceiver 21 into electrical signals, a bit synchronization circuit 23 connected to the O/E converter 22, a serial/parallel converter 24 for converting bit signals serially output from the bit synchronization circuit 23 into parallel data in units of predetermined bits, an upstream frame termination unit 25 which identifies data output from the serial/parallel converter 24 to terminate an upstream frame and stores user data included in the upstream frame into an upstream data buffer 26, and an internal interface 27 which reads out data from the upstream data buffer 26 at an internal transmission rate and transfers the data to an upper layer termination unit 40.

The upper layer termination unit 40 is connected to a network 14 via, for example, a switch and a network interface which are not shown. The upstream frame termination unit 25 extracts, for example, notification information (queue information) indicating the state of transmission data enqueued in each subscriber side apparatus from the upstream frame and transfers the information to a controller 28. The controller 28 calculates an upstream bandwidth and a transmission time zone to be assigned to each subscriber side apparatus, based on bandwidth setting information specified in advance by a manager and the queue information notified from the upstream frame termination unit 25, and updates the contents of a bandwidth management table 29 periodically.

Downstream user data packets supplied from the upper layer termination unit 40 to the internal interface 27 is input to a downstream data buffer 30, temporarily stored there, and then read out by a downstream frame generator 31. The downstream frame generator 31 generates a downstream frame comprising a set of user data packets read out from the downstream data buffer 30 and monitoring control data attached thereto and outputs the downstream frame to an E/O converter 32. After converted into optical signals, the downstream frame is transmitted to the optical fiber 11-$i$ through the optical transceiver 21.

Figure 1:
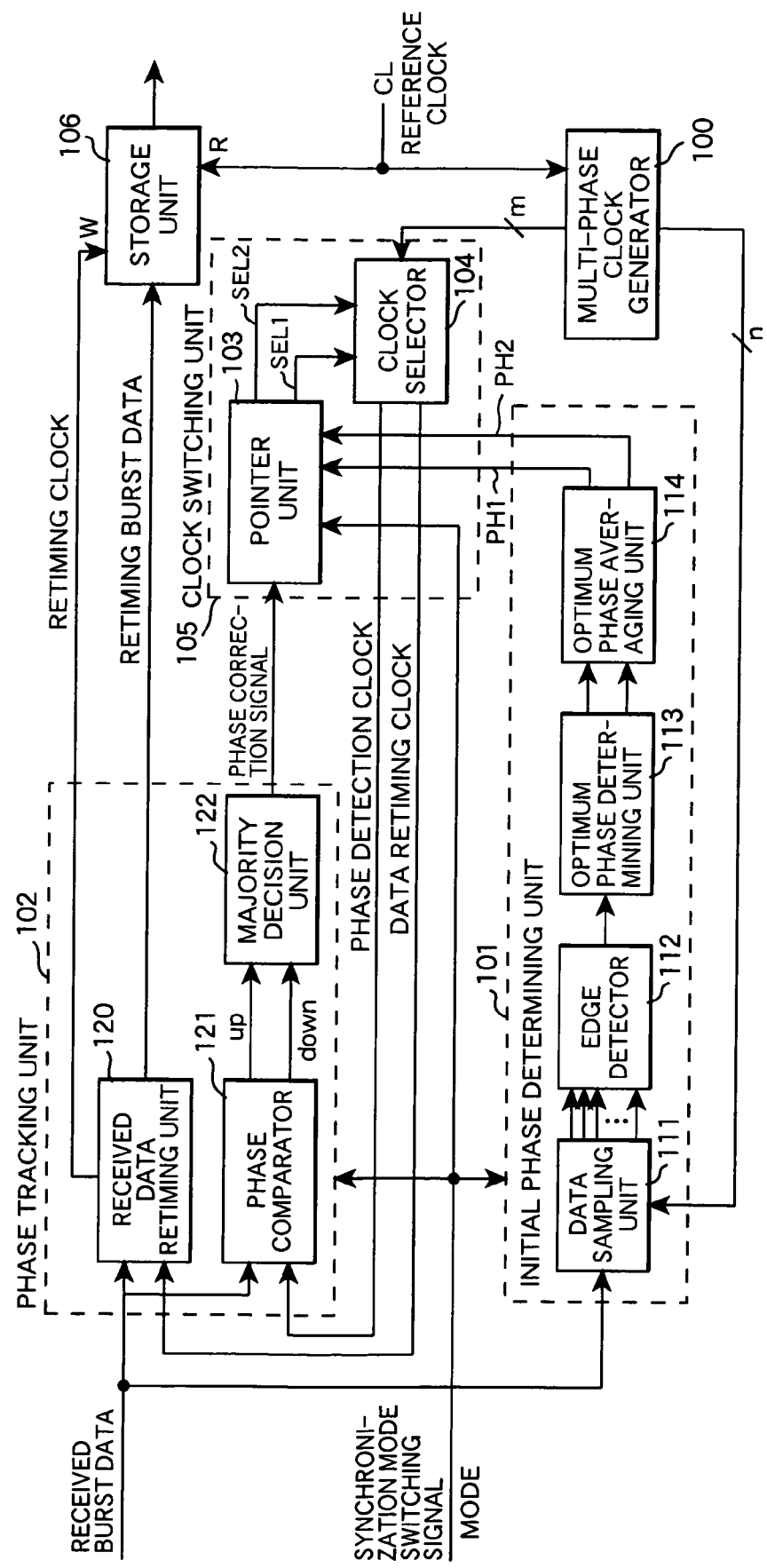
FIG. 1 is a bock diagram showing an embodiment of a bit synchronization circuit 1 of the present invention.
Figure 2:
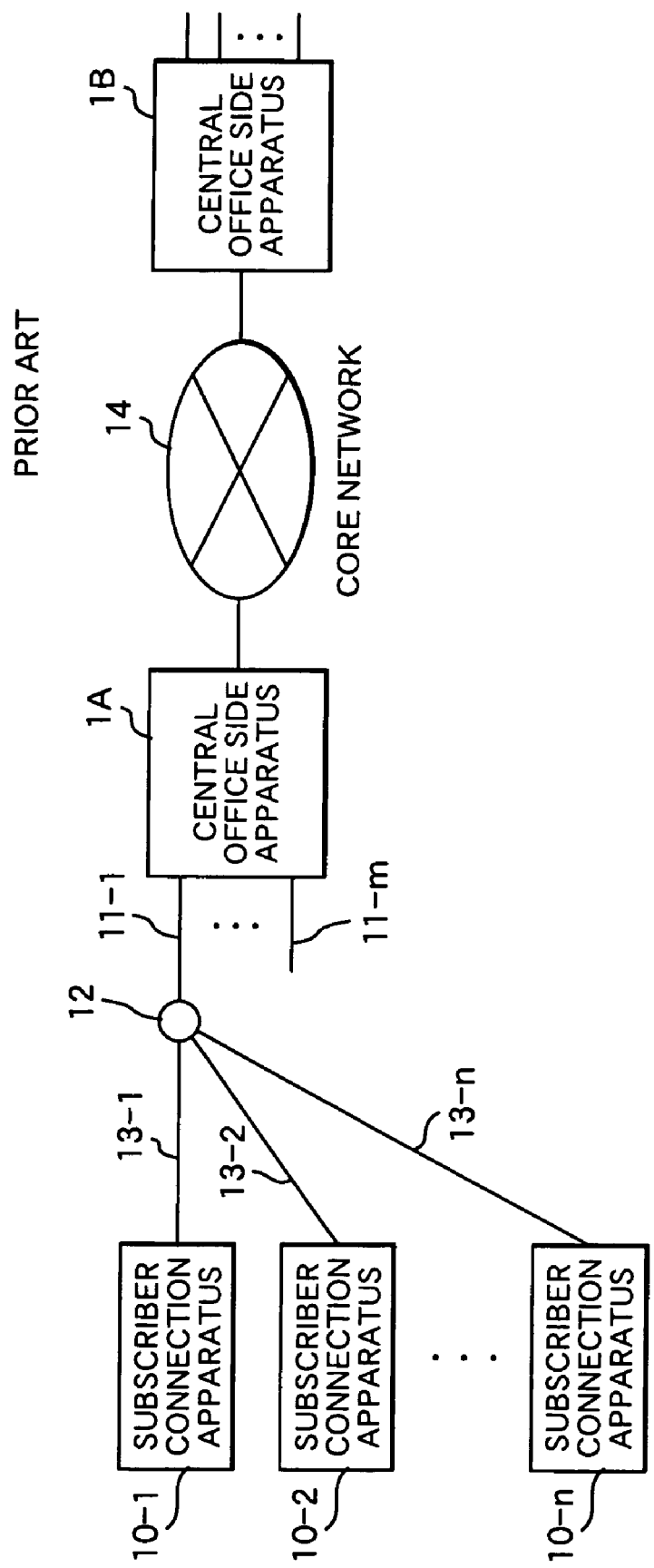
FIG. 2 shows a network topology to which a PON system is applied.
Figure 3:
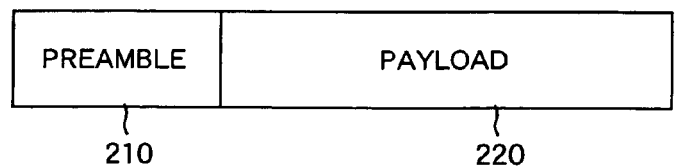
FIG. 3 shows the structure of a burst data, which is input to a bit synchronization circuit.
Figure 4:
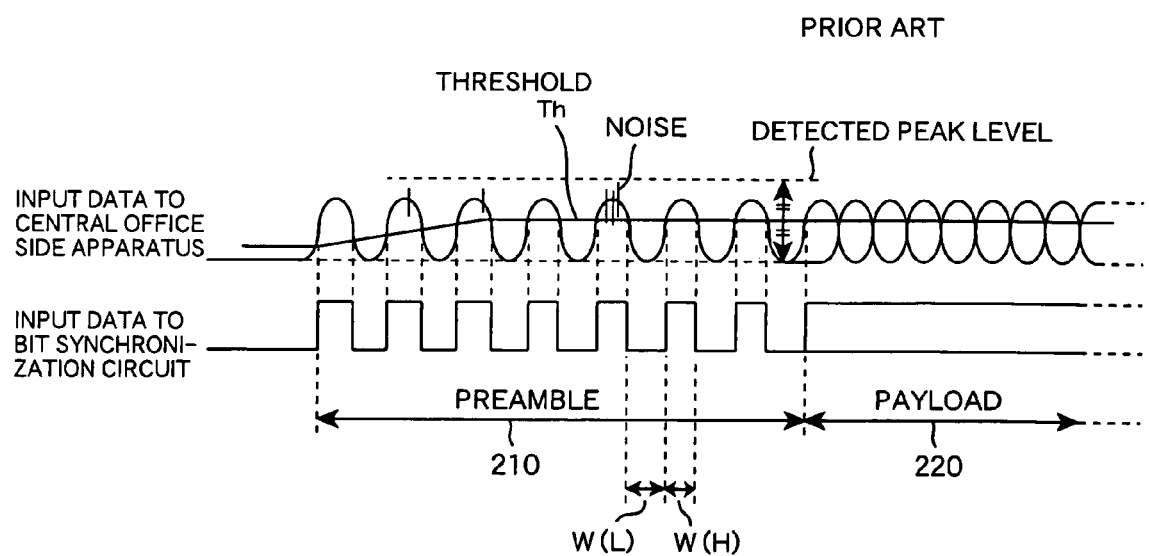
FIG. 4 shows a model of burst data to be input to a bit synchronization circuit.
Figure 5:
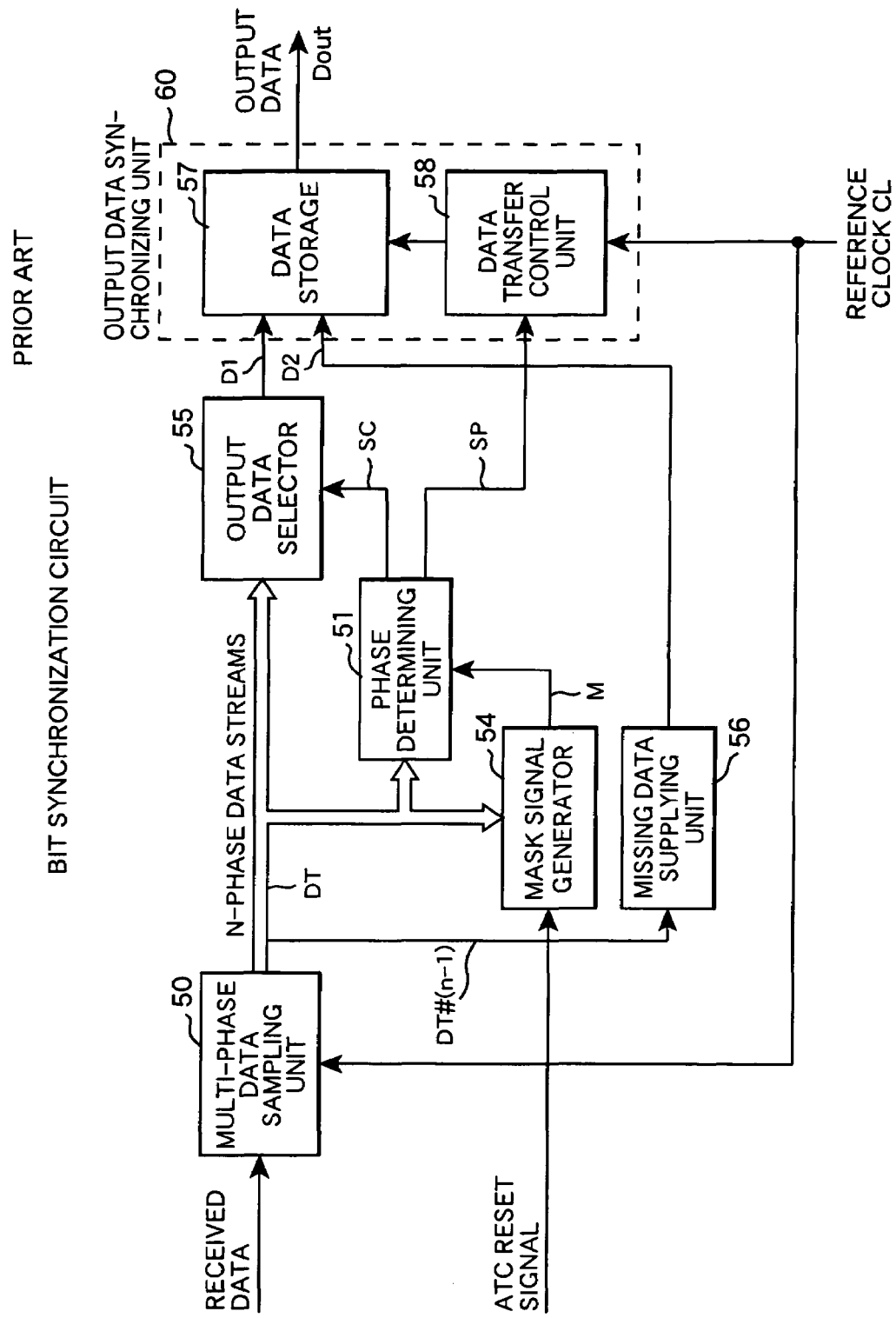
FIG. 5 is a block diagram showing an example of a prior art bit synchronization circuit.

As will be detailed with FIG. 1, the bit synchronization circuit 23 performs synchronization and phase tracking on the received burst data in accordance with an internal reference clock CL having a frequency of f0 generated from a reference clock generator 20 and a synchronization mode switching signal "MODE" supplied from the controller 28. Although the reference clock generator 20 is shown here as one of elements of the subscriber line interface, the reference clock generator 20 may be shared by a plurality of subscriber line interfaces in the central office side apparatus 1A.

Figure 7:
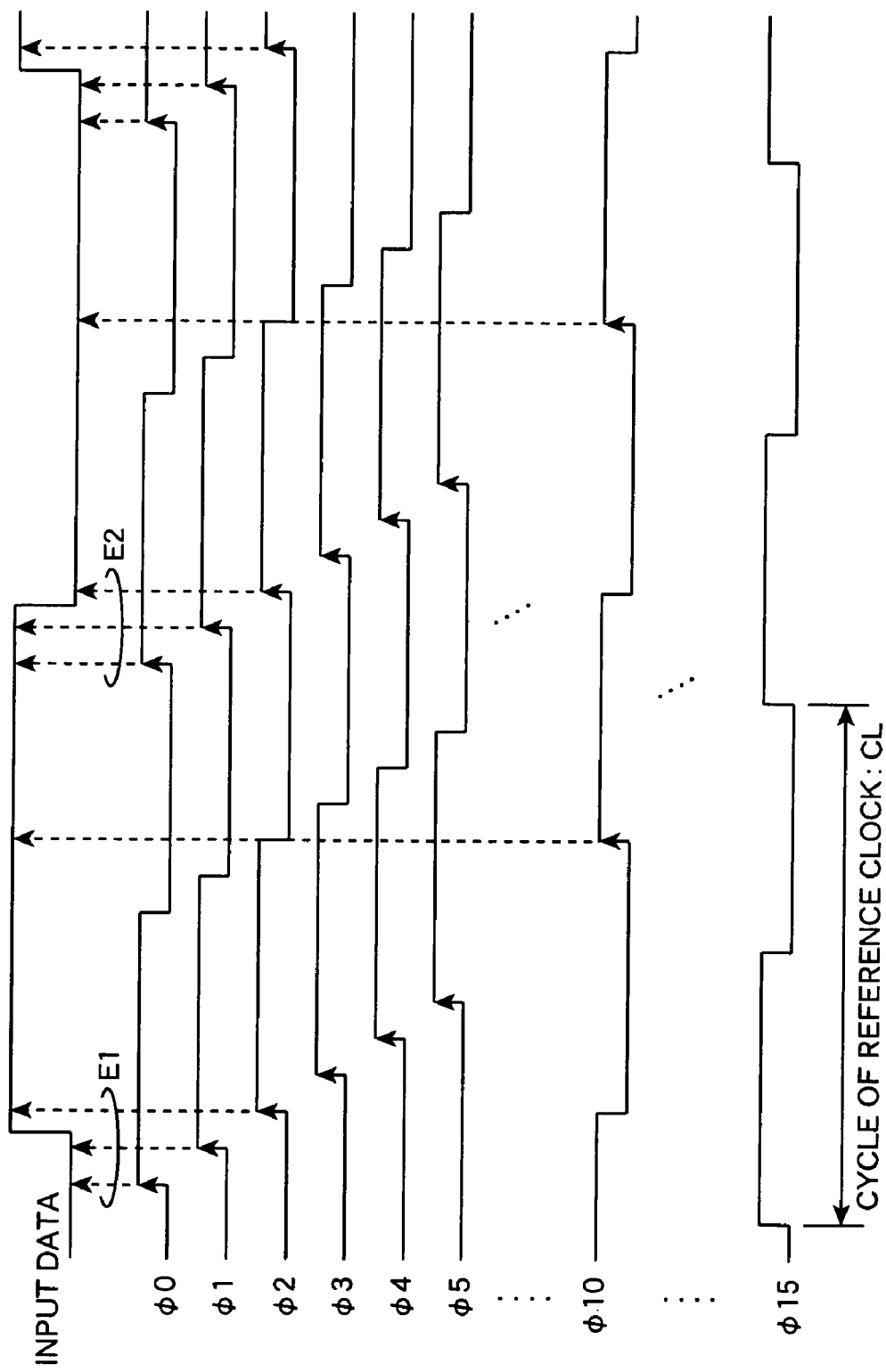
FIG. 7 is a timing chart of signal waveforms representing timing relations between a received data signal and multi-phase clocks to be applied to the bit synchronization circuit of the present invention.

FIG. 7 is a timing chart of signal waveforms representing timing relations between a received data signal and multi-phase clocks to be applied to the bit synchronization circuit 23 of the present invention.

In the bit synchronization circuit 23 of the present invention, N-phase clocks (where N=16) indicated by, for example, $\phi 0$ to $\phi 15$, are produces based on the internal reference clock CL having a frequency of f0 generated from the reference clock generator 20. With these clocks, received data signals supplied from the O/E converter 22 are sampled. By latching (or sampling) the received data signal at rising edge of each clock, for example, 16-phase data streams are generated. By transforming these data streams into 16-phase data streams each synchronized with the phase of a clock $\phi 15$ and by performing Exclusive OR operations for adjacent data streams, a clock synchronized with data change points of the received signal can be detected (Edge detection).

In the example shown here, as denoted by dashed lines E1, when two data streams generated based on clocks $\phi 0$ and $\phi 1$ are in the state of "0," the other data streams generated based on clock $\phi 2$ and subsequent clocks are in the state of "1."

Accordingly, by outputting N-phase data streams sampled with N-phase clocks in synchronization with an (n-1)th phase clock and comparing these streams, it can be detected that the clock $\phi 2$ is synchronized with a rising edge of the received data signal. As denoted by dashed lines E2, when the data streams generated based on clocks $\phi 0$ and $\phi 1$ are in the state of "1," the other data streams generated based on clock $\phi 2$ and subsequent clocks are in the state of "0." Thus, it is found that the clock $\phi 2$ is also synchronized with a falling edge of the received data. In this case, by latching the received data signal at the rising edges of a clock $\phi 10$, which is separated by n/2 phases from the clock $\phi 2$, it is able to discriminate the "1" and "0" states of the received data exactly.

In the following description, a clock synchronized with the edges (change points) of a received data signal, like the clock $\phi 2$, will be referred to as a "synchronized phase clock" and a clock optimum for sampling a received data signal, like the clock $\phi 10$, will be referred to as a "data retiming clock."

FIG. 8 is a timing chart outlining the operation of the bit synchronization circuit 23 of the present invention.

As will be detailed later with reference to FIG. 1, the bit synchronization circuit 23 of the present invention is equipped with an initial phase determining unit and a phase tracking unit. The initial phase determining unit operates during the preamble period of burst data received to determine a synchronized phase clock and an optimum data retiming clock. On the other hand, the phase tracking unit operates during the payload period of burst data. The phase tracking unit, in principle, starts retiming of received burst data based on the data retiming clock determined by the initial phase determining unit, tracks a phase variation of the received burst data by applying the clock determined by the initial phase determining unit as initial synchronized phase clock, and dynamically optimizes the phase of the data retiming clock.

As shown in FIG. 8, the operation of the bit synchronization circuit is divided into a period T1 of initial phase determining mode and a period T2 of phase tracking mode in accordance with the status of the synchronization mode switching signal "MODE."

Timing of synchronization mode switching is selectable for each system by changing a control parameter to be set for the controller 28. The controller 28 measures and stores a signal propagation time on a transmission path for each subscriber connection apparatus in a ranging process that is performed when a subscriber connection apparatus 10 is connected to the PON system. Thus, the controller 28 can predict the timing of receiving the burst data from each subscriber connection apparatus within a precision of ±several bits when it assigns a transmission time zone to the subscriber connection apparatus.

During the period T1 of initial phase determining mode, the initial phase determining unit detects signal change points in the preamble in which 0 and 1 bits appear alternately by applying the N-phase clocks and determines a phase number of a synchronized phase clock and a phase number of a data retiming clock every two cycles of the internal reference clock. Phase numbers of the data retiming clock determined periodically during the period T1 are averaged for each period ΔT1 of pre-specified N cycles (N is an integer of 4 or greater) of the internal reference clock and output as a optimum phase number such as $\phi h$, $\phi i$, and $\phi j$. At the same time, the phase numbers of the synchronized phase clock are also averaged and output as well from the initial phase determining unit. In the following description, the phase number of data retiming clock and the phase number of synchronized phase clock determined by the initial phase determining unit are altogether referred to as initial phase information.

In an embodiment of the present invention, M-phase clocks having the internal reference clock frequency f0 are generated in addition to the above N-phase clocks and retiming of received burst data is performed with a data retiming clock φf selected from among the M-phase clocks. The data retiming clock φf that is applied for retiming of received burst data is selected from among the M-phase clocks based on the phase number of optimum data retiming clock output from the initial phase determining unit.

By making the number of M phases greater than the number of N phases, phase differences of the N-phase clocks can be made coarser than that of the M-phase clocks to be applied for phase tracking of received burst data. However, the number of N phases may be equal to the number of M phases. If the number of phases of M-phase clocks differs from the number of phases of N-phase clocks, the phase number PH1 of optimum data retiming clock and the phase number PH2 of synchronized phase clock, output from the initial phase determining unit, are translated into corresponding phase numbers of M-phase clocks according to a correlation between M and N.

Upon entering the period T2 of phase tracking mode by changing the synchronization mode switching signal "MODE," the phase tracking unit starts retiming of payload data by applying the data retiming clock φf selected from among the M-phase clocks based on the last data retiming clock phase number φj output from the initial phase determining unit.

For the period T2 of phase tracking mode, by applying one of the M-phase clocks corresponding to the last synchronized phase clock output from the initial phase determining unit as the initial phase, the phase tracking unit optimizes the phase of the data retiming clock φf for every majority decision cycle ΔT2 specified in advance. Specifically, the phase tracking unit detects for advanced-phase/delayed-phase of the change points of input burst data, relative to the synchronized phase clock, and optimizes the data retiming clock φf to be applied to the next cycle ΔT2(2) according to the result of majority decision for advanced-phase/delayed-phase occurred within one cycle ΔT2(1). At this time, the phase of the clock to be used to detect for advanced-phase/delayed-phase in the next cycle ΔT2(2) is also optimized.

In the following description, the synchronized phase clock to be used to detect for phase variation of input signal in the phase tracking unit will be particularly defined as a "phase detection clock." The phase tracking unit repeats the operations of retiming of input burst data and detecting for phase variation, applying the data retiming clock φf and the phase detection clock updated by phase tracking in the preceding cycle, for every majority decision cycle ΔT2.

In FIG. 8, there is no discrimination between the N-phase clocks and M-phase clocks for simplification purposes and the data retiming clock φf to be applied to the first majority decision cycle ΔT2(1) is represented by the last optimum data retiming clock φj output from the initial phase determining unit. The data retiming clock φf (φj) is modified, according to the result of majority decision in the cycle ΔT2(1), to a retiming clock such as phase unchanged φj (even), phase advanced φj (up), or phase delayed φj (down) which becomes the data retiming clock φf (φk) to be applied to the next cycle ΔT2(2).

The data retiming clock φf (φk) is also modified, according to the result of majority decision in the cycle ΔT2(2), to a retiming clock such as φk (even), φk (up), or φk (down) which becomes the data retiming clock φf (φl) to be applied to the further next cycle ΔT2(3).

FIGS. 9A, 9B, and 9C show timing of mode switchover according to the synchronization mode switching signal "MODE."

As shown in FIG. 9B, the controller 28 generates the synchronization mode switching signal "MODE" at timing when the preamble period terminates, assuming that burst data is input with its phase being supposedly most advanced. In an instance where burst data is input with its phase being ideal, the synchronization mode switchover takes place before the end part of the preamble is received, as shown in FIG. 9A. In an instance where burst data is input with its phase being supposedly most delayed, a considerable amount of the preamble receiving period remains immediately after the start of the period T2 of phase tracking mode, as shown in FIG. 9C.

FIG. 1 is a block diagram showing an embodiment of the bit synchronization circuit 23 according to the present invention.

The bit synchronization circuit 23 of the present embodiment is comprised of a multi-phase clock generator 100 for generating N-phase clocks and M-phase clocks based on the internal reference clock CL having a frequency of f0, an initial phase determining unit 101 and a phase tracking unit 102, to both of which burst data is input from the O/E converter 22, a clock switching unit 105 for dynamically switching the phases of data retiming clock and phase detection clock to optimum phases, and a storage unit 16 for buffering data retimed with the data retiming clock by the phase tracking unit 102 and outputting the data in synchronization with the internal reference clock CL.

The clock switching unit 105 is comprised of a pointer unit 103 for generating clock selection control signals (SEL1, SEL2) based on the initial phase information (PH1, PH2) output from the initial phase determining unit 101 and a phase correction signal output from the phase tracking unit 102, and a clock selector 104 for selecting, according to the clock selection control signals, an optimum data retiming clock and an optimum phase detection clock to be supplied to the phase tracking unit 102 from among the M-phase clocks output from the multi-phase clock generator 100.

Here, the multi-phase clock generator 100 generates N-phase clocks by delaying the phase of the internal reference clock CL having the frequency of f0 in steps of 1/n, for example, 16-phase clocks from clock φ0 to clock φ15, as illustrated in FIG. 7. On the other hand, M-phase clocks are generated by delaying the phase of the internal reference clock CL having the frequency of f0 in steps of 1/m. For example, 32-phase clocks having more phases than the N-phase clocks are generated as M-phase clocks. However, the values of n and m are arbitrary and may be set as n=8 and m=16. In the following description, the N-phase clocks are represented by clocks φ0 to φ(n−1) in order of phases and the M-phase clocks by clocks φ0 to φ(m−1) in order of phases.

The initial phase determining unit 101 is comprised of a data sampling unit 111 for latching received burst data at the rising edges of the N-phase clocks φ0 to φ(n−1) output from the multi-phase clock generator 100 and outputting N data streams, each of which is phase aligned with the most delayed phase clock φ(n−1), an edge detector 112 for detecting a clock with a phase synchronized with the change points (the rising edge or falling edge of a pulse) of received data from the N data streams and outputting the synchronized phase clock identifier (phase number) and the edge type as detection information, an optimum phase determining unit 113 for storing the detection information output from the edge detector 112 and determining a phase number of optimum synchronized phase clock and a phase number of optimum data retiming clock by analyzing the detection information for every unit period of two cycles (2T0) of the internal reference clock CL, and an optimum phase averaging unit 114 for storing the phase number of synchronized phase clock and the optimum phase number of data retiming clock output from the optimum phase determining unit 113, averaging the respective phase numbers for every averaging cycle ΔT1 as described for FIG. 8, and outputting a number PH1 of data retiming clock phase and a phase number PH2 of synchronized clock as initial phase information.

The optimum phase averaging unit 114, for example, may serially add the phase numbers of synchronized phase clock and the phase numbers of data retiming clock periodically output for every unit period of 2T0 from the optimum phase determining unit 113, respectively, by adders, and divide the results of the additions by the number of times of the additions for the preset averaging period ΔT1. Alternatively, optimum phase averaging unit 114 may store the phase numbers up to a preset count of the phase numbers to be averaged and perform addition and division on the phase numbers for every averaging period ΔT1.

The phase tracking unit 102 is comprised of a received data retiming unit 120, a phase comparator 121, and a majority decision unit 122.

The received data retiming unit 120 latches the received burst data at the rising edges of a data retiming clock supplied from the clock selector 104 and outputs the retimed burst data to the storage unit 106. At this time, the data retiming clock is supplied as the retiming clock to the storage unit 106. The retimed burst data is written into the storage unit 106 with the retiming clock and read out in synchronization with the reference clock CL.

In parallel with the operation of the received burst data retiming unit 120, the phase comparator 121 compares a phase detection clock supplied from the clock selector 104 to the change points of the received burst data and outputs a phase correction signal ("up" to advance the phase, "down" to delay the phase) according to the result of the comparison. The majority decision unit 122 counts phase correction signals output from the phase comparator 121 for the period of a predetermined cycle ΔT2 as described for FIG. 8 and outputs a phase correction signal determined by majority decision.

As described already, pulse width distortion might occur in an optical signal transmitted through an optical fiber 11, and the change points of data signal to be detected by the edge detector 112 during the preamble receiving period do not always appear at constant intervals. To maximize the phase margin of a data retiming clock to sample received data having a pulse width distortion, essentially, it is advisable to select a data retiming clock having a phase which is positioned at a middle point between two synchronized phases detected at two consecutive change points on the time axis, as described for FIG. 7.

A minimum interval between two successive change points appearing on the time axis can be estimated beforehand from presupposed pulse width distortion and an amount of jitter superimposed on input data. Accordingly, if an interval between successive change points detected by the edge detector 112 is less than the estimated minimum interval, it is regarded that incorrect change points have been detected due to noise. In that case, the optimum phase determining unit 113 may reject the synchronized phase clock identifier output from the edge detector 112 to improve noise immunity.

Even when an interval between two successive change points appearing on the time axis is less than a first minimum interval pre-estimated based on presupposed pulse width distortion, if the interval is greater than a second minimum interval even shorter than the first one, estimated from pre-supposed pulse width distortion and maximum jitter, a difference between the first minimum interval and the interval between the change points can be regarded as a jitter-induced error. In this case, the optimum phase determining unit 113 may correct the phase of the synchronized phase clock output from the edge detector 112 by shifting it to a center phase of normal distribution of jitter, assuming that jitter-induced displacement of the change points is normally distributed relative to the normal positions of the change points. By this correction, the possibility of erroneous determination of a synchronized phase clock due to jitter superimposed on input signal can be reduced.

Figure 10:
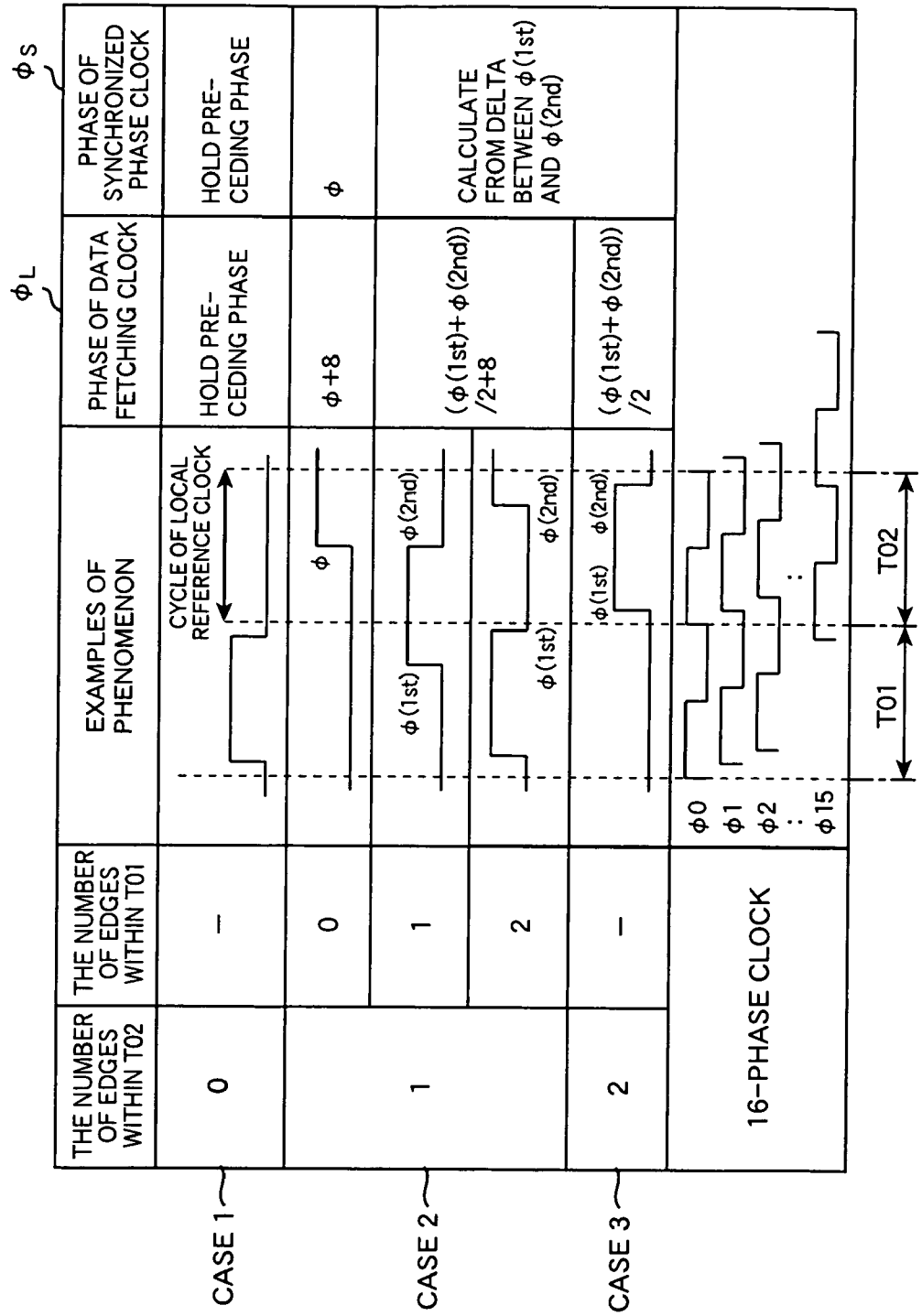
FIG. 10 shows relationships between results of synchronized phase detection performed by an edge detector 112 and outputs of an optimum phase determining unit 113 shown in FIG. 1.

FIG. 10 tabulates relationships between results of synchronized phase detection performed by the edge detector 112 and results of determination performed by the optimum phase determining unit 113. This table presents examples of phase φL of data retiming clock and phase φS of synchronized phase clock output from the optimum phase determining unit 113 when the edge detector 112 has detected, by applying 16-phase clocks, the change points of input signal as illustrated in a column labeled "examples of phenomenon" during two cycles of T01 and T02 of the internal reference clock CL.

In case 1, the number of edges detected within the second cycle T02 is 0. The optimum phase determining unit 113 selects the phases determined in the preceding determination cycle as the phases of data retiming clock φL and synchronized phase clock φS.

In case 2, the number of edges detected within the second cycle T02 is 1. If the number of edges detected within the first cycle T01 is 0, the optimum phase determining unit 113 adopts the synchronized phase φ detected this time as the phase φS of synchronized phase clock and selects a phase separated by n/2 (here, n=16) from the synchronized phase φ as the phase φL of data retiming clock. In case 2, if the number of edges detected within the first cycle T01 is 1 or 2, the optimum phase determining unit 113 discretely determines the phase φS of synchronized phase clock depending on the distance between the last detected synchronized phase φ(1st) within the first period T01 and the synchronized phase φ(2nd) detected within the second cycle T02 by the edge detector 112. In this case, as the phase φL of data retiming clock, a phase separated by n/2 from a phase at the middle point between the phase φ(1st) and the phase φ(2nd), [φ(1st)+φ(2nd)]/2+8, is selected.

In case 3, the number of edges detected within the second cycle T02 is 2. In this case, the optimum phase determining unit 113 determines the phase φS of synchronized phase clock in the same manner as for case 2 where the number of edges detected within the first cycle T01 is 1 or 2, taking two synchronized phases detected within the second cycle T02 by the edge detector 112 as φ(1st) and φ(2nd), independently of the number of edges detected within the first cycle T01. As the phase φL of data retiming clock, a phase at the middle point between the phase φ(1st) and the phase φ(2nd), [φ(1st)+φ(2nd)]/2, is selected.

A time zone for transmitting burst data from each subscriber connection apparatus 10 is specified by the controller 28 on the central office side apparatus 1A. The controller 28 can predict timing of receiving each burst data with a considerable degree of precision, according to the pre-measured signal propagation time on a transmission path for each subscriber connection apparatus. Therefore, by using the synchronization mode switching signal "MODE," the controller 28 can activate the initial phase determining unit 101 at the time to start receiving burst data and, essentially, stop the operation of the initial phase determining unit 101 and activate the phase tracking unit 102 before receiving a payload.

The timing to switch from the initial phase determining mode to the phase tracking mode can be optimized for each system, taking account of the precision of predicted timing of payload receiving, the number of bits contained in the preamble, the number of times of averaging to be performed by the optimum phase averaging unit 114 in the initial phase determining unit 101, etc.

In the embodiment shown in FIG. 1, in concurrence with a switchover from the initial phase determining mode to the phase tracking mode, the operation mode of the pointer unit 103 is also switched by the synchronization mode switching signal "MODE." During the operation of the initial phase determining unit 101, the pointer unit 103 receives phase numbers of data retiming clock and synchronized phase clock, generates clock selection control signals SEL1, SEL2, taking these phase numbers as an offset value (a reference value), and controls the clock selector 104.

Figure 11:
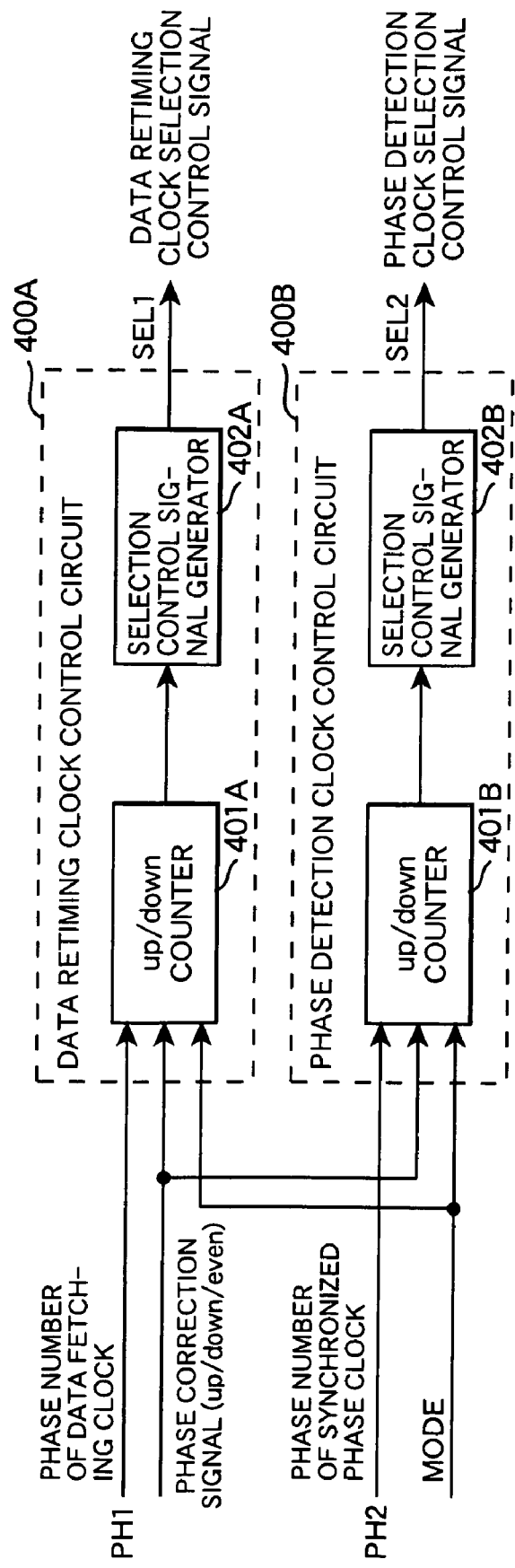
FIG. 11 is a block diagram showing an embodiment of a pointer unit 103 shown in FIG. 1.

The pointer unit 103 is comprised of, for example, as shown in FIG. 11, a data retiming clock control circuit 400A and a phase detection clock control circuit 400B. The control circuits 400A and 400B are identical in construction and each circuit is comprised of an up/down counter 401 (401A or 401B) and a selection control signal generator 402 (402A or 402B).

Difference between the two control circuits 400A and 400B lies in the type of initial phase number information to be supplied to the up/down counter 401. That is, the phase number PH1 of data retiming clock output from the initial phase determining unit 101 is input to the up/down counter 401A of the control circuit 400A, and the phase number PH2 of synchronized phase clock output from the initial phase determining unit 101 is input to the up/down counter 401B of the control circuit 400B.

To each up/down counter 401, in addition to the initial phase number, the synchronization mode switching signal "MODE" and a phase correction signal (up/down/even) output from the phase tracking unit 102 are input. While the synchronization mode switching signal indicates the initial phase determining mode, each up/down counter 401 stores the phase numbers supplied as the initial phase number. In the initial phase determining mode, the phase correction signal (up/down/even) is ignored and incrementing or decrementing the phase numbers is not performed. Therefore, the phase number supplied as the initial phase number is notified to the selection control signal generator 402 as a count value.

When the synchronization mode is switched to the phase tracking mode, each up/down counter 401 ignores a subsequent change in the value of initial phase number and increments or decrements the count value or keeps the current count value unchanged, according to the phase correction signal (up/down/even) supplied from the phase tracking unit 102.

Each up/down counter 401 repeats the count operation of the phase number in the phase tracking mode for every majority decision cycle ΔT2. The count values of the phase number updated by the up/down counters 401A, 401B are output to the selection control signal generators 402A, 402B, respectively. The selection control signal generators 402A, 402B change the clock selection control signals SEL1, SEL2 in accordance with the updated counts, respectively. The clock selector 104 selects a data retiming clock and a phase detection clock from among the M-phase clocks generated by the multi-phase clock generator 100 according to the clock selection control signals (phase numbers) SEL1, SEL2, and supplies the selected clocks to the phase comparator 121 in the phase tracking unit 102.

FIGS. 12A, 12B, and 12C show relationships between waveforms of input burst data and results of phase determination (up/down) output from the phase comparator 121 in the phase tracking unit 102.

As shown in FIG. 12B, two cycles of phase detection clock are taken as one unit and the two cycles are divided into four ½ cycle sections: (1) "φ(n)−π" to "φ(n)", (2) "φ(n)" to "φ(n)+π", (3) "φ(n)+π" to "φ(n+1)", and (4) "φ(n+1)" to "φ(n+1)+π". Depending on where the change points of received burst data appear in these sections (1) to (4), the phase comparator 121 of the present embodiment determines the relation in phase between the received burst data and the phase detection clock. FIG. 12C shows an ideal phase of input data. For payload data that is actually received by the phase tracking unit 102, there is a possibility of phase shifts from the ideal phase of input data, as shown in FIG. 12A.

Figure 13:
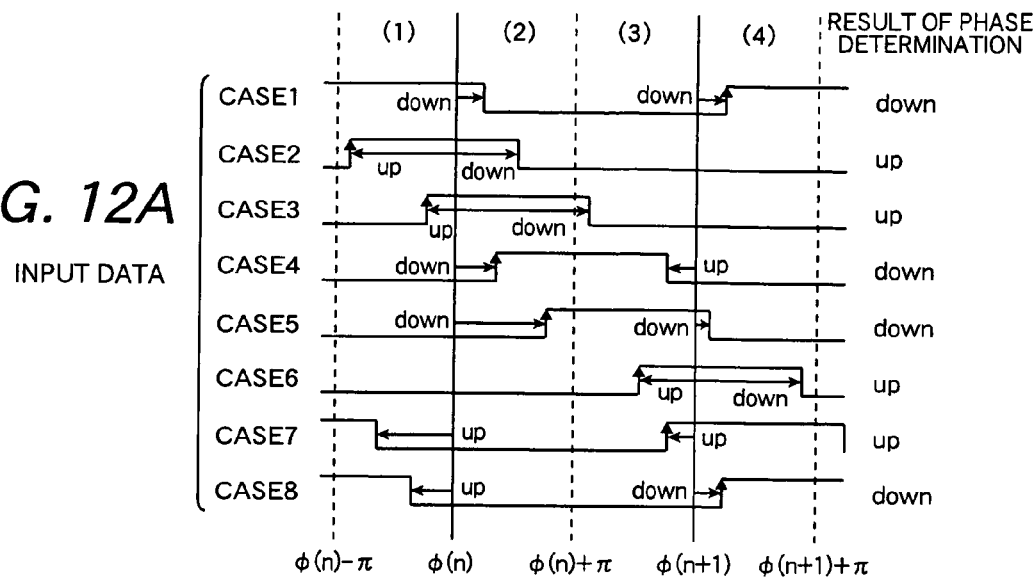
FIG. 13 shows an example of advanced-phase/delayed-phase decision logics in the phase comparator 121.

FIG. 13 shows an example of advanced-phase/delayed-phase decision logics for relating the positions of edges (signal change points) appearing in input burst data to results of phase determination output from the phase comparator 121.

To adapt the phase of a data retiming clock to phase change in the received burst data, the phase comparator 121 determines whether to advance (up) or delay (down) the phase detection clock from the present phase, according to the advanced-phase/delayed-phase decision logics and outputs an up signal or down signal to the majority decision unit 122. For example, CASE 1 in FIG. 12A corresponds to decision logic number 11 in FIG. 13 and CASE 2 corresponds to number 4. Any other case corresponds to any of the decision logics in FIG. 13.

As described above, in a possible case of pulse width distortion occurring in input data, the pulse width for logic "1" may become narrower than a width of ½ cycle of the phase detection clock (section width in FIG. 12). The decision logics of FIG. 13 exclude such an extremely narrow pulse from the scope of decision. The phase comparator 121 may output results of phase determination every cycle or every two cycles of the phase detection clock.

Figure 14:
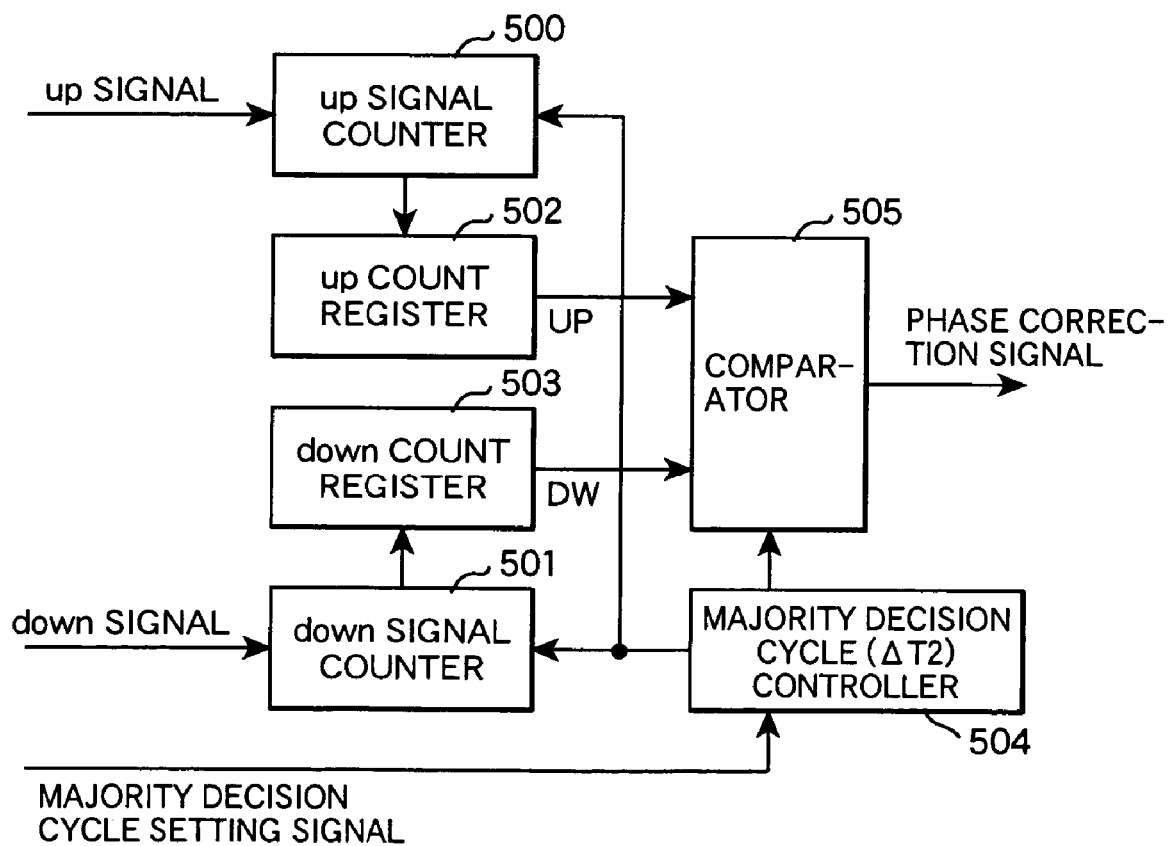
FIG. 14 is a block diagram showing an embodiment of a majority decision unit 122 shown in FIG. 1.

FIG. 14 shows an embodiment of the majority decision unit 122 in the phase tracking unit 102.

The majority decision unit 122 makes a majority decision on the results (up/down) of phase determination received from the phase comparator 121 for each pre-specified majority decision cycle (ΔT2) and outputs a result of the decision as a phase correction signal indicating to advance the phase ("up"), delay the phase ("down"), or keep the phase unchanged ("even") to the pointer unit 103.

The majority decision unit 122 is comprised of an up signal counter 500 for counting the number of times of up signals received from the phase comparator 121, a down signal counter 501 for counting the number of times of down signals received from the phase comparator 121, an up count register 502 for storing the count value of the up signal counter 500, a down count register 503 for storing the count value of the down signal counter 501, a majority decision cycle (ΔT2) controller 504, and a comparator 505 for comparing the values of the registers 502, 503.

At the start of every majority decision cycle (ΔT2) specified by a majority decision cycle setting signal which is supplied externally, the majority decision cycle (ΔT2) controller 504 resets the count values of the counters 500, 501 and instructs the comparator 505 to execute comparison operation. The up signal counter 500 and the down signal counter 501 count up signals and down signals received from the phase comparator 121 by ripple counters, respectively. The count values of the counters 500 and 501 are latched into the registers 502 and 503 each time they are updated. The comparator 505 compares the values of up count "UP" and down count "DW" transferred from the registers 502, 503 at timing specified from the controller 504 and outputs a phase correction signal (up/down/even) corresponding to a comparison result (UP>DW, UP<DW, UP=DW).

As will be appreciated from the foregoing embodiment, according to the bit synchronization circuit 23, the data retiming clock to be supplied from the clock selector 104 to the phase tracking unit 102 is optimized for each cycle ΔT2, responsive to phase variation of received burst data, and the received data retiming unit 120 can correctly discriminate the 1 and 0 bit states of payload data. Since the burst data (payload) retimed by the received data retiming unit 120 is read out from the storage unit 106 in synchronization with the reference clock, bit synchronization adaptive to phase variation of received burst data can be achieved.

The capacity of the storage unit 106 may be determined for each system, according to phase variation and the maximum length of burst data predicted for a section of PON. Consumption current can be reduced by deactivating the initial phase determining unit 101 (data sampling unit 111, edge detector 112, optimum phase determining unit 113, and optimum phase averaging unit 114) during the phase tracking mode after switchover by the synchronization mode switching signal "MODE".

As is obvious from the foregoing embodiment, the bit synchronization circuit of the present invention is equipped with the initial phase determining unit and the phase tracking unit and these functional units are made to operate selectively by the synchronization switching signal. According to the present invention, during the period of receiving the preamble of burst data, starting in a state where the input data phase is unknown, the initial phase determining unit determines the phase of a data retiming clock dynamically (discretely) taking account of pulse width distortion. During the period of receiving the payload of burst data, after the input data phase has been identified, the data retiming clock phase can be optimized for each predetermined cycle by phase tracking in the phase tracking unit. Thus, the bit synchronization circuit can perform rapid pulling received burst data into synchronization and phase tracking with noise immunity.

In order to select a data retiming clock with a phase that is proper to discriminate bits of received data or a phase detection clock synchronized with the change points of received data from among multi-phase clocks, a relatively large scale logic circuit is required. According to the configuration of the present invention, however, power consumption in the bit synchronization circuit can be reduced, because clock phase selection by dual edge detection is required only for the initial phase determining mode. Furthermore, since the bit synchronization circuit of the present invention adopts a multi-clock selection method, it is unnecessary to take measures against data missing and duplication induced by phase change of received data that would be required in the case where a multi-data selection method is applied.

What is claimed is:

1. A bit synchronization circuit for retiming received burst data which is comprised of a preamble and a payload so as to output data synchronized with an internal reference clock, comprising:
    a multi-phase clock generator for generating multi-phase clocks with different phases and having the same frequency as said internal reference clock;
    an initial phase determining unit for detecting change points of received signal using said multi-phase clocks and outputting initial phase information including a phase number of a clock synchronized with the change points, during a period of receiving the preamble of the burst data;
    a clock switching unit for switching a data retiming clock and a phase detection clock to optimum phase clocks, respectively;
    a phase tracking unit for converting the received data into data retimed according to said data retiming clock, determining whether the phase of the signal change points of received signal is advanced or delayed relative to the phase detection clock, and outputting a phase correction signal corresponding to a result of the determination, during a period of receiving the payload of the burst data; and
    a data storage unit for temporarily storing the retimed data output from said phase tracking unit and outputting the data in synchronization with said internal reference clock,
    wherein said clock switching unit selects a first data retiming clock and a first phase detection clock to be supplied to said phase tracking unit from among said multi-phase clocks, based on the initial phase information output from said initial phase determining unit, and subsequently, switches the data retiming clock and the phase detection clock to be supplied to said phase tracking unit to optimum phase clocks according to the phase correction signal output from said phase tracking unit.

2. The bit synchronization circuit according to claim 1, wherein:
    said clock switching unit comprises:
    a pointer unit for generating a clock selection control signal in accordance with the initial phase information output from said initial phase determining unit and the phase correction signal output from said phase tracking unit; and
    a clock selector for selecting an optimum data retiming clock and an optimum phase detection clock to be supplied to said phase tracking unit from among the multi-phase clocks generated by said multi-phase clock generator, according to said clock selection control signal.

3. The bit synchronization circuit according to claim 1, wherein:
    said phase tracking unit comprises:
    a received data retiming unit for converting received data into retimed data in synchronization with said data retiming clock and outputting the retimed data;
    a phase comparator for determining whether the phase of the signal change points of the received signal is advanced or delayed relative to said phase detection clock, and outputting a result of the determination; and
    a majority decision unit for making a majority decision on results of the determination output from said phase comparator for every predetermined period and generating a phase correction signal to optimize said phase detection clock.

4. The bit synchronization circuit according to claim 1, wherein:
    said initial phase determining unit comprises:
    a data sampling unit for sampling the received signal with the multi-phase clocks generated by said multi-phase clock generator and outputting phase aligned multi-phase data as a result of the sampling;
    an edge detector for detecting change points of the received signal based on the multi-phase data output from said data sampling unit, and outputting a phase number of a clock synchronized with the signal change points;

an optimum phase determining unit for determining periodically a phase number of a synchronized phase clock synchronized with the change points of received signal and a phase number of an optimum data retiming clock for every unit period, based on the phase numbers output from said edge detection unit; and an optimum phase averaging unit for averaging the phase numbers of the synchronized phase clocks and the phase numbers of optimum data retiming clocks output from said optimum phase determining unit, respectively, for every averaging period longer than the unit period and outputting the averaged phase numbers as said initial phase information.

5. The bit synchronization circuit according to claim 4, wherein said optimum phase determining unit determines the phase number of said synchronized phase clock and the phase number of said optimum data retiming clock based on the phase number output from said edge detection unit, for every unit period of two cycles of said internal reference clock.

6. The bit synchronization circuit according to claim 5, wherein said edge detector outputs the type of change points of the received signal and the phase number of a clock synchronized with the change points, and said optimum phase determining unit takes a phase number corresponding to the rising edge of a pulse appearing in the received signal as the phase number of said synchronized phase clock and determines the phase number of said optimum retiming clock from two phase numbers corresponding to two change points adjacent on the time axis.

7. The bit synchronization circuit according to claim 1, wherein said multi-phase clock generator generates N-phase clocks with different phases and having the same frequency as said internal reference clock and M-phase clocks with different phases and having the same frequency as said internal reference clock (where M≧N), said initial phase determining unit detects change points of the received signal using said N-phase clocks, and said clock switching unit selects a data retiming clock and a phase detection clock to be supplied to said phase tracking unit from among said M-phase clocks.

8. The bit synchronization circuit according to claim 1, wherein an operation period of said initial phase determining unit and an operation period of said phase tracking unit are switched over by a synchronization mode switching signal.

9. The bit synchronization circuit according to claim 8, wherein, said synchronization mode switching signal switches over from the operation period of said initial phase determining unit to the operation period of said phase tracking unit after activating said initial phase determining unit before receiving each burst data, at timing when the preamble terminates in a case of receiving burst data with the most advanced phase as predicted.

10. The bit synchronization circuit according to claim 2, wherein:

said phase tracking unit comprises:

a received data retiming unit for converting received data into retimed data in synchronization with said data retiming clock and outputting the retimed data;

a phase comparator for determining whether the phase of the signal change points of the received signal is advanced or delayed relative to said phase detection clock, and outputting a result of the determination; and a majority decision unit for making a majority decision on results of the determination output from said phase comparator for every predetermined period and generating a phase correction signal to optimize said phase detection clock.

11. The bit synchronization circuit according to claim 2, wherein:

said initial phase determining unit comprises:

a data sampling unit for sampling the received signal with the multi-phase clocks generated by said multi-phase clock generator and outputting phase aligned multi-phase data as a result of the sampling;

an edge detector for detecting change points of the received signal based on the multi-phase data output from said data sampling unit, and outputting a phase number of a clock synchronized with the signal change points;

an optimum phase determining unit for determining periodically a phase number of a synchronized phase clock synchronized with the change points of received signal and a phase number of an optimum data retiming clock, based on the phase numbers output from said edge detection unit for every unit period; and an optimum phase averaging unit for averaging the phase numbers of the synchronized phase clocks and the phase numbers of optimum data retiming clocks output from said optimum phase determining unit, respectively, for every averaging period longer than the unit period and outputting the averaged phase numbers as said initial phase information.

12. The bit synchronization circuit according to claim 11, wherein said optimum phase determining unit determines the phase number of said synchronized phase clock and the phase number of said optimum data retiming clock based on the phase number output from said edge detection unit, for every unit period of two cycles of said internal reference clock.

13. The bit synchronization circuit according to claim 12, wherein said edge detector outputs the type of change points of the received signal and the phase number of a clock synchronized with the change points, and said optimum phase determining unit takes a phase number corresponding to the rising edge of a pulse appearing in the received signal as the phase number of said synchronized phase clock and determines the phase number of said optimum retiming clock from two phase numbers corresponding to two change points adjacent on the time axis.

* * * * *